(12) United States Patent
Murata et al.

(10) Patent No.: US 10,014,200 B2
(45) Date of Patent: Jul. 3, 2018

(54) GAS INJECTION DEVICE AND ASSISTING MEMBER

(71) Applicant: MURATA MACHINERY, LTD., Kyoto-shi, Kyoto (JP)

(72) Inventors: Masanao Murata, Mie (JP); Takashi Yamaji, Mie (JP)

(73) Assignee: MURATA MACHINERY, LTD., Kyoto (JP)

( * ) Notice: Subject to any disclaimer, the term of this patent is extended or adjusted under 35 U.S.C. 154(b) by 61 days.

(21) Appl. No.: 15/101,085

(22) PCT Filed: Dec. 12, 2014

(86) PCT No.: PCT/JP2014/083001
§ 371 (c)(1),
(2) Date: Jun. 2, 2016

(87) PCT Pub. No.: WO2015/118775
PCT Pub. Date: Aug. 13, 2015

(65) Prior Publication Data
US 2016/0307785 A1 Oct. 20, 2016

(30) Foreign Application Priority Data

Feb. 7, 2014 (JP) ................................. 2014-022082

(51) Int. Cl.
*H01L 21/67* (2006.01)
*H01L 21/673* (2006.01)
(Continued)

(52) U.S. Cl.
CPC .......... *H01L 21/67389* (2013.01); *F17C 5/00* (2013.01); *H01L 21/67393* (2013.01);
(Continued)

(58) Field of Classification Search
CPC ......... H01L 21/67389; H01L 21/67393; H01L 21/67745; F17C 5/00
See application file for complete search history.

(56) References Cited

U.S. PATENT DOCUMENTS 5,810,062 A * 9/1998 Bonora ............. H01L 21/67393
141/351
5,988,233 A * 11/1999 Fosnight ........... H01L 21/67376
141/63
(Continued)

FOREIGN PATENT DOCUMENTS

JP  3055728 U     1/1999
JP  2002-510150 A 4/2002
(Continued)

OTHER PUBLICATIONS

English translation of Official Communication issued in corresponding International Application PCT/JP2014/083001, dated Aug. 9, 2016.
(Continued)

*Primary Examiner* — Timothy L Maust
(74) *Attorney, Agent, or Firm* — Keating & Bennett, LLP

(57) ABSTRACT

A gas injection device a placement portion on which a first or second container is placed, an ejection portion which is placed on the placement portion and ejects a purge gas, and a sealing portion protruding from the placement portion so as to surround a periphery of the ejection portion. The ejection portion, with the purge gas being injected into an inlet of the second container, does not come in contact with the inlet. The sealing portion, with the purge gas being injected into an inlet of the FOUP, does not impede the contact between the ejection portion and the inlet.

4 Claims, 6 Drawing Sheets

(51) Int. Cl.
*H01L 21/677* (2006.01)
*F17C 5/00* (2006.01)

(52) U.S. Cl.
CPC ............ *H01L 21/67745* (2013.01); *F17C 2205/0335* (2013.01); *F17C 2221/00* (2013.01); *F17C 2270/0518* (2013.01)

(56) References Cited

U.S. PATENT DOCUMENTS

| | | | | |
|---|---|---|---|---|
| 6,319,297 | B1 * | 11/2001 | Fosnight | B01D 46/008 |
| | | | | 141/98 |
| 6,368,411 | B2 * | 4/2002 | Roberson, Jr. | H01L 21/67017 |
| | | | | 118/715 |
| 7,950,524 | B2 * | 5/2011 | Lin | F16K 15/147 |
| | | | | 118/715 |
| 8,061,738 | B2 * | 11/2011 | Okabe | F16J 15/002 |
| | | | | 15/301 |
| 8,596,312 | B2 * | 12/2013 | Natsume | H01L 21/67775 |
| | | | | 141/63 |
| 2012/0272928 | A1 | 11/2012 | Kameyama | |

FOREIGN PATENT DOCUMENTS

| | | |
|---|---|---|
| JP | 2007-317909 A | 12/2007 |
| JP | 2009-277688 A | 11/2009 |
| JP | 2010-040912 A | 2/2010 |
| JP | 2010-147451 A | 7/2010 |

OTHER PUBLICATIONS

English translation of Official Communication issued in corresponding International Application PCT/JP2014/083001, dated Jan. 27, 2015.
Official Communication issued in International Patent Application No. PCT/JP2014/083001, dated Jan. 27, 2015.

* cited by examiner

GAS INJECTION DEVICE AND ASSISTING MEMBER

BACKGROUND OF THE INVENTION

1. Field of the Invention

The present invention relates to a gas injection device, such as a gas injection device that injects a gas into a container such as a FOUP (Front-Opening Unified Pod) that houses a semiconductor wafer or the like.

2. Description of the Related Art

A gas injection device, where a gas is injected into the inside of an airtight container via a gas inlet provided at a bottom of the airtight container, has heretofore been known. For example, JP-T-2002-510150 shows a system where a gas is injected through an interface seal, which is provided on a support surface for supporting a pod, into an inlet, which is formed at the bottom of the pod that is an airtight container.

However, in the system described in JP-T-2002-510150, a grommet that constitutes the interface seal has a size conforming to the shape of a well attached to the inlet of the pod. Therefore, if the diameter of the well formed on the bottom of the pod does not conform to the grommet, it is difficult to use the system. Accordingly, if the system is used for multiple types of pods with different well diameters, the grommets do not match any of the well diameters, so that the gas may not be injected properly.

SUMMARY OF THE INVENTION

Preferred embodiments of the present invention provide a gas injection device that is capable of injecting a gas into various containers, even when multiple types of containers are provided with inlets having different diameters for each container.

According to one aspect of various preferred embodiments of the present invention, a gas injection device injects a purge gas into a first inlet provided on a first container, or a second inlet provided on a second container and having a diameter larger than that of the first inlet, and includes a placement portion on which the first container or the second container is placed; an ejection portion which is placed on the placement portion and ejects the purge gas; and a sealing portion protruding from the placement portion so as to surround a periphery of the ejection portion with the purge gas being injected into the second inlet. The ejection portion comes in contact with the first inlet and then seals the first inlet with the purge gas being injected into the first inlet, while not coming in contact with the second inlet with the purge gas being injected into the second inlet. The sealing portion, with the purge gas being injected in the second inlet, comes in contact with the second inlet or a peripheral edge of the second inlet and then seals the second inlet in cooperation with the placement portion, while not impeding the contact between the ejection portion and the first inlet with the purge gas being injected into the first inlet.

Such a gas injection device includes the ejection portion that ejects the purge gas; and the sealing portion protruding from the placement portion so as to surround the periphery of the ejection portion when the purge gas is injected into the second container. The ejection portion, with the purge gas being injected into the first inlet, comes in contact with the first inlet and then seals the first inlet, so that the gas injection device allows the purge gas to be injected through the first inlet into the first container. Moreover, the ejection portion, with the purge gas being injected into the second inlet, does not come in contact with the second inlet. At this time, the sealing portion protruding from the placement portion so as to surround the periphery of the ejection portion comes in contact with the second inlet or the peripheral edge of the second inlet and then seals the second inlet in cooperation with the placement portion. Thus, in the gas injection device, a space defined by the ejection portion, the placement portion, the sealing portion and the second inlet is kept airtight, so that the gas ejected from the ejection portion is able to be injected into the second inlet. In addition, the sealing portion, with the purge gas being injected into the first inlet, is structured and located so as not to impede the contact between the ejection portion and the first inlet, so that the purge gas is able to be injected through the ejection portion into the first inlet without hindrance. With such a configuration, even when each container has different inlet diameters, the gas injection device allows the purge gas to be injected into the various containers.

In one preferred embodiment of the present invention, the sealing portion may include an elastic body that enables the sealing portion to easily deform. Accordingly, when the gas is injected into the first inlet, the sealing portion becomes deformed such that the contact between the ejection portion and the first inlet is not impeded.

In one preferred embodiment of the present invention, the sealing portion may include a film-shaped elastic body, be tilted towards the inside with the purge gas being injected into the second inlet, and include a leading end portion positioned into the second inlet and coming in contact with the second inlet. Accordingly, with the purge gas being injected into the second inlet, the pressure of gas in the space defined by the ejection portion, the placement portion, the sealing portion and the second inlet allows the sealing portion to be easily brought into close contact with the second inlet, thus being able to significantly reduce or prevent gas leakage.

In addition, an assisting member according to one aspect of various preferred embodiments of the present invention is provided on a gas injection device which includes a placement portion on which a container including an inlet into which a purge gas is injected is placed, and an ejection portion which is provided on the placement portion and ejects the purge gas. The assisting member is a member that assists the injection of the purge gas and includes a base portion having an annular shape and attached so as to surround a periphery of the ejection portion; and a side wall portion extended from the base portion. The side wall portion is tapered so as to tilt towards the inside.

In such an assisting member, the side wall portion is extended from the base portion which surrounds the periphery of the ejection portion, so that the assisting member protrudes from the placement portion so as to surround the periphery of the ejection portion. Accordingly, when the purge gas is injected into the inlet larger in diameter than the ejection portion, the assisting member is capable of sealing the inlet. Additionally, since the side wall portion of the assisting member preferably has a tapered shape, the pressure of gas flowing inside of the assisting member allows the assisting member to be easily brought into close contact with the inlet, thus being able to significantly reduce or prevent gas leakage.

According to various preferred embodiments of the present invention, it is possible to provide a gas injection device that is capable of injecting a purge gas into the various containers, even when multiple types of containers are provided with inlets having different diameters for each container.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be explained hereinafter in detail with reference to the attached drawings. For the sake of convenience, in the description of the drawings, the same reference signs are given to the same or corresponding elements and omit duplicated explanation. Preferred embodiments of the present invention can be broadly applied to a gas injection device that injects a gas into a container. However, examples of applying preferred embodiments of the present invention to a gas injection device that injects a gas into two types of FOUPs having gas inlets of different diameter will be described below.

Figure 1A:
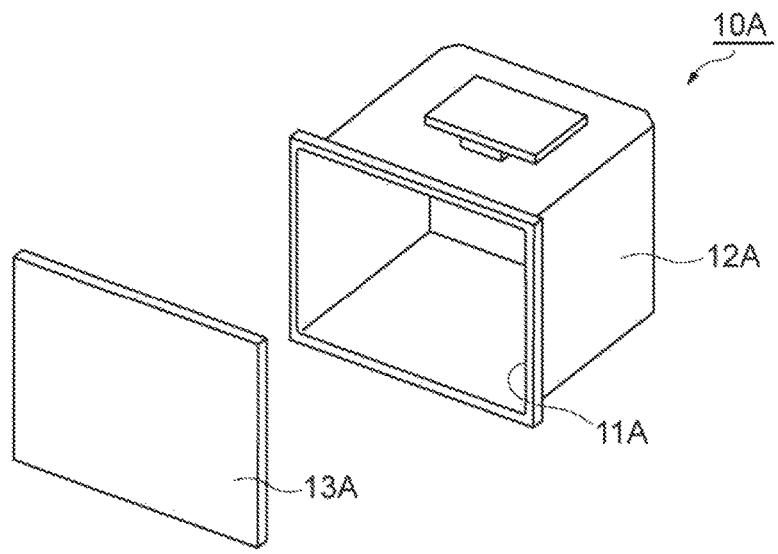
FIG. 1A is a perspective view showing a FOUP.

First, a FOUP into which a gas injection device 1 (refer to FIG. 2) according to the present preferred embodiment injects a purge gas is explained. FIG. 1A is a perspective view showing a FOUP 10A (first container). As shown in FIG. 1A, the FOUP 10A includes a container main body 12A including a front surface (one side surface) on which an opening 11A is provided, and a cover portion 13A attached to the opening 11A of the container main body 12A. A wafer holder which is not illustrated is provided inside the container main body 12A, such that wafers are able to be housed in the FOUP 10A. In addition, by having the cover portion 13A being attached to the opening 11A, the inside of the FOUP 10A is maintained airtight.

Figure 1B:
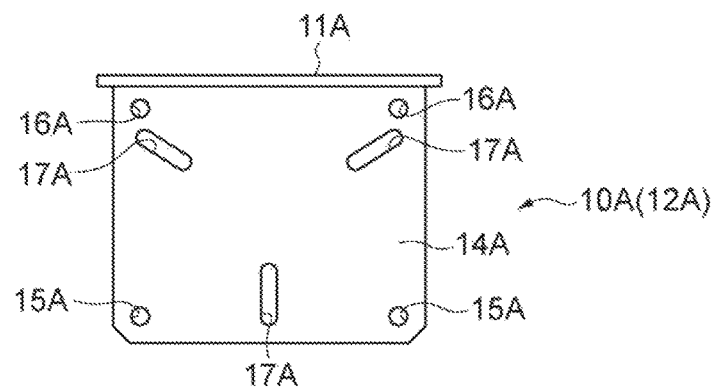
FIG. 1B is a bottom view of the FOUP in FIG. 1A.

FIG. 1B is a bottom view of the container main body 12A of the FOUP 10A. As shown in FIG. 1B, a bottom portion 14A of the container main body 12A is provided with: inlets (first inlets) 15A that supply the purge gas into the FOUP 10A; outlets 16A that discharge the purge gas within the FOUP 10A; and positioning portions 17A used to determine a position when the container main body 12A is placed on the gas injection device 1.

The inlets 15A, on the bottom portion 14A of the container main body 12A, are respectively provided in corners of the left and right sides of the rear side (opposite side of the opening 11A). The outlets 16A, on the bottom portion 14A of the container main body 12A, are respectively provided in corners of the left and right sides of the front side (opening side). In addition, the positioning portions 17A are provided in two places on the front side and in one place on the rear side. Here, the inlets 15A of the FOUP 10A, for example, define check valves that become open when pressed by a predetermined force.

Figure 1C:
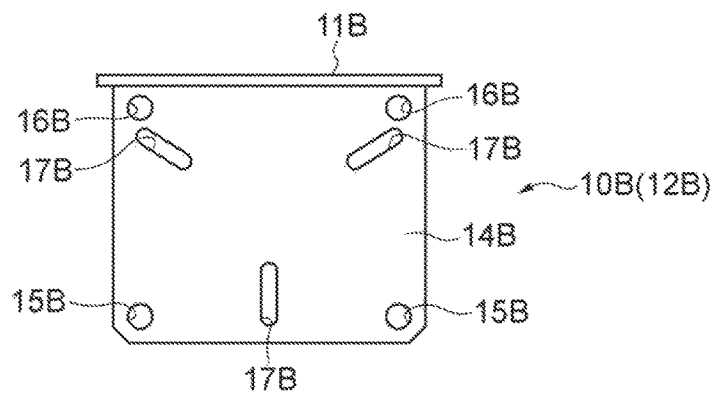
FIG. 1C is a bottom view of the FOUP which is different in the shape of the bottom portion.

FIG. 1C is a bottom view of a container main body 12B of a FOUP 10B (second container) whose configuration is different from the FOUP 10A. In the FOUP 10B, the configurations of inlets 15B and outlets 16B on a bottom portion 14B are different from the FOUP 10A. As shown in FIG. 1C, the bottom portion 14B of the container main body 12B of the FOUP 10B is provided with inlets (second inlets) 15B, outlets 16B and positioning portions 17B.

The inlets 15B, on the bottom portion 14B of the container main body 12B, are provided in the corners of the left and right sides of the rear side (opposite side of the opening 11B). The outlets 16B, on the bottom portion 14B of the container main body 12B, are provided in the corners of the left and right sides of the front side (opening side). In addition, the positioning portions 17B are, similarly to the FOUP 10A, provided in two places on the front side and in one place on the rear side. Here, the inlets 15B of the FOUP 10B, for example, define check valves that become open when the purge gas is supplied with a predetermined pressure.

The diameters of the inlets 15B and the outlets 16B of the FOUP 10B are preferably larger than those of the inlets 15A and the outlets 16A of the FOUP 10A. In the present preferred embodiment, for example, the diameters of the inlets 15A and the outlets 16A of the FOUP 10A preferably are approximately 25 mm, for example. The diameters of the inlets 15B and the outlets 16B of the FOUP 10B, for example, are approximately 50 mm. Here, the FOUPs 10A, 10B are, for example, designed based on the same standards. Accordingly, when the FOUPs 10A, 10B are placed in predetermined positions by the positioning portions 17A, 17B, the center positions of the inlets 15A and the outlets 16A of the FOUP 10A coincide with the center positions of the corresponding inlets 15B and outlets 16B of the FOUP 10B.

Figure 2:
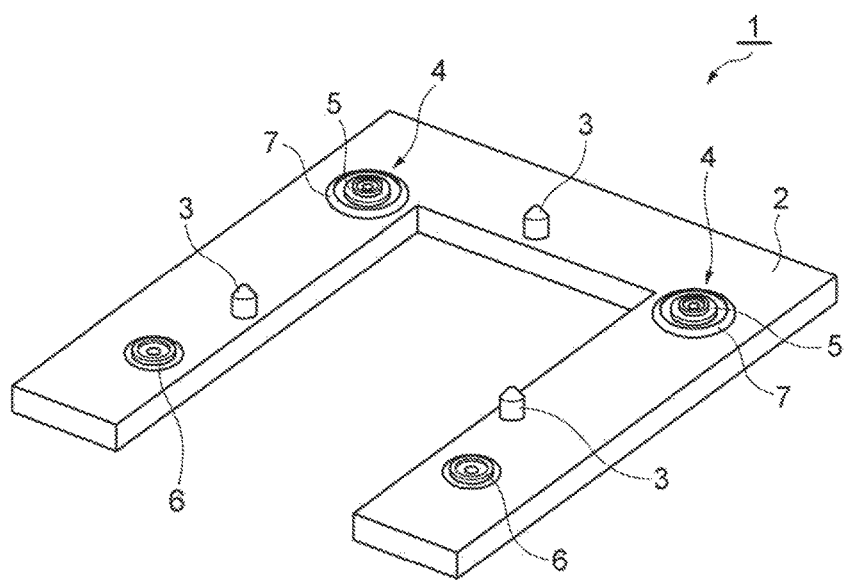
FIG. 2 is a perspective view showing a gas injection device according to a preferred embodiment of the present invention.

The gas injection device 1 that injects the purge gas into such FOUPs 10A, 10B is explained below. FIG. 2 is a perspective view schematically showing the gas injection device 1. The gas injection device 1 shown in FIG. 2 is applied to a load port, a purge stocker, a ceiling buffer, or the like in a semiconductor manufacturing line. The gas injection device 1 injects the purge gas from the inlets 15A, 15B provided on the bottom portions 14A, 14B of the FOUPs 10A, 10B placed on a placement portion 2 (see below).

As shown in FIG. 2, the gas injection device 1 includes: a placement portion 2 on which the FOUPs 10A, 10B are placed; gas injection portions 4 that inject the purge gas into the FOUPs 10A, 10B; and gas discharge portions 6 that discharge the purge gas that has been discharged from the FOUPs 10A, 10B. The purge gas is an inert gas, for example, a nitrogen gas.

The placement portion 2 includes an upper surface (placement surface) 2a on which the FOUPs 10A, 10B are placed. The placement portion 2, for example, has a nearly U-shaped form. On the placement portion 2, the positioning pins 3 that correspond to the positioning portions 17A, 17B of the FOUPs 10A, 10B protrude from the upper surface 2a, such that the FOUPs 10A, 10B are able to be placed in predetermined positions. On the placement portion 2, the gas injection portions 4 and the gas discharge portions 6 are respectively disposed at the positions corresponding to the inlets 15A, 15B and the outlets 16A, 16B of the FOUPs 10A, 10B placed in predetermined positions.

Figure 3:
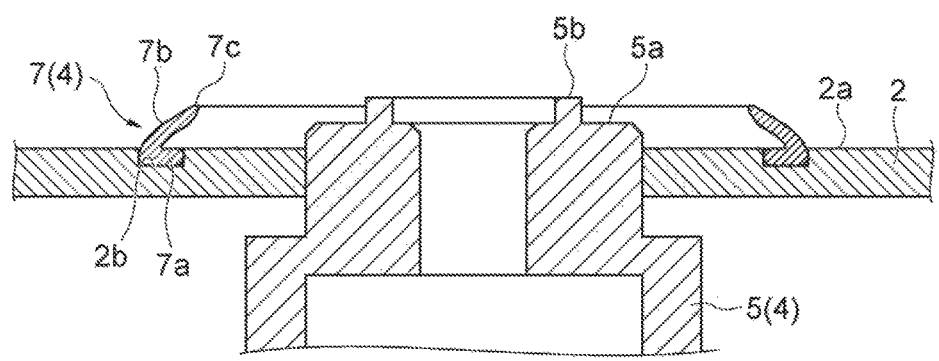
FIG. 3 is a partially enlarged sectional view of a gas injection portion in the gas injection device in FIG. 2.

FIG. 3 is a partially enlarged sectional view of the gas injection portion 4 on the gas injection device 1. As shown in FIG. 3, the gas injection portion 4 includes an ejection portion 5 and a sealing portion 7. The ejection portion 5 is a tubular member (nozzle) through which the purge gas flows. A gas supply (not shown) including gas pipes or the like, to supply the purge gas connects to the ejection portion 5. A first end portion 5a of the ejection portion 5 protrudes upward above the upper surface 2a of the placement portion 2.

The first end portion 5a of the ejection portion 5 includes an annular protruded portion 5b provided thereon, the annular protruded portion 5b protruding farther upward from the end surface. In the present preferred embodiment, the protruded portion 5b of the ejection portion 5 comes in contact with the inlet 15A of the FOUP 10A, and then the ejection portion 5 and the inlet 15A communicate with each other, so that the purge gas is injected into the FOUP 10A. At the periphery of the ejection portion 5, for example, a sealing material not shown is disposed, thus securing the airtightness between the ejection portion 5 and the placement portion 2. Note that, depending on the material or hardness, etc., of the inlet 15A, there are cases in which the protruded portion 5b and the inlet 15A may have difficulty in communicating with each other in an airtight manner. In this case, the sealing material may be disposed at the leading end side of the protruded portion 5b.

The sealing portion 7 is a member that assists the injection of the purge gas, and is disposed nearly concentrically to the ejection portion 5 so as to surround the periphery of the ejection portion 5. The sealing portion 7 includes a base portion 7a having an annular shape with a larger diameter than the ejection portion 5, and a side wall portion 7b extended from the base portion 7a.

The base portion 7a is disposed at an annular groove portion 2b provided on the placement portion 2, and is airtightly fixed to the groove portion 2b. The base portion 7a of the sealing portion 7 is disposed on the placement portion 2 so as to surround the periphery of the ejection portion 5, so that the side wall portion 7b protruding from the placement portion 2 is also disposed so as to surround the periphery of the ejection portion 5. The side wall portion 7b is tapered so as to tilt towards the inside, and has a diameter becoming gradually smaller towards a leading end portion 7c. The sealing portion 7, for example, preferably has a film shape (thin plate shape) with an elastic body such as a fluorine polyolefin resin, a urethane resin or a urethane rubber, such that elastic deformation is able to be performed easily by the action of external force. In the present preferred embodiment, the sealing portion 7 comes in contact with the inlet 15B of the FOUP 10B, and then the ejection portion 5 and the inlet 15B communicate with each other, so that the purge gas is injected into the FOUP 10B.

The gas discharge portion 6 comes in contact with the outlets 16A, 16B of each FOUP 10A, 10B and discharges the purge gas that has been discharged from the outlets 16A, 16B. An exhaust pipe that exhausts gas (not shown) connects to the gas discharge portion 6.

Figure 4:
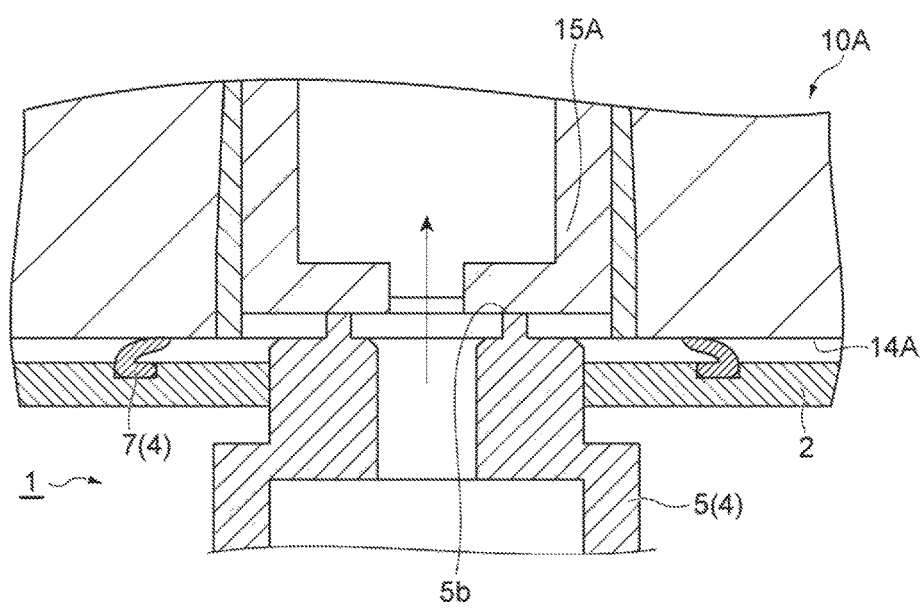
FIG. 4 is a partially enlarged sectional view showing the relationship between the gas injection device and the FOUP.
Figure 5:
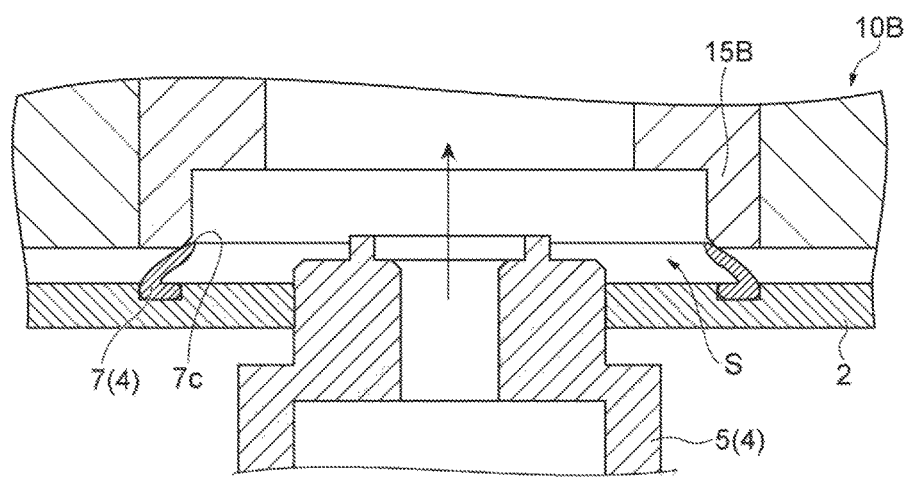
FIG. 5 is a partially enlarged sectional view showing the relationship between the gas injection device and the FOUP.

A non-limiting example of a method where a gas injection device 1 injects a purge gas into each of FOUPs 10A, 10B is explained below with reference to FIG. 4 and FIG. 5. First, the case in which the gas injection device 1 injects the purge gas into the FOUP 10A is explained. FIG. 4 is a partially enlarged sectional view showing the relationship between the gas injection device 1 and the FOUP 10A. As shown in FIG. 4, once the FOUP 10A is placed on a placement portion 2 of the gas injection device 1, a sealing portion 7 that comes in contact with a base portion 14A of the FOUP 10A is pressed by the FOUP 10A and is elastically deformed in such a way as to be pushed down. In this way, the sealing portion 7 retracts towards the placement portion 2, so that a protruded portion 5b of an ejection portion 5 comes in contact with an inlet 15A of the FOUP 10A. Thereafter, a check valve is opened by the pressure of the purge gas. However, the inlet 15A is pressed by the ejection portion 5 with the weight of the FOUP 10A, such that the check valve of the inlet 15A may be opened.

The inlet 15A has a prescribed elasticity, such that when the protruded portion 5b of the ejection portion 5 comes in contact with the inlet 15A, the contact surface between the inlet 15A and the ejection portion 5 is sealed, and the ejection portion 5 and the inlet 15A communicate with each other. In this state, as indicated with an arrow in FIG. 4, the purge gas is ejected from the ejection portion 5, so that the purge gas is injected into the FOUP 10A.

The case in which the gas injection device 1 injects the purge gas into a FOUP 10B is explained below. FIG. 5 is a partially enlarged sectional view showing the relationship between the gas injection device and the FOUP 10B. As shown in FIG. 5, once the FOUP 10B is placed on the placement portion 2 of the gas injection device 1, the sealing portion 7 comes in contact with an inlet 15B of the FOUP 10B. The sealing portion 7 is thereafter pressed by the inlet 15B, so that it is elastically deformed so as to tilt towards the inside. The sealing portion 7 includes an elastic body, thus making the contact surface between the sealing portion 7 and the inlet 15B airtight.

In the present preferred embodiment, the inlet 15B preferably has a recessed shape, a leading end portion 7c of the sealing portion 7 is located inside the inlet 15B that preferably has a recessed shape, and an outer peripheral surface of the sealing portion 7 comes in contact with the inlet 15B. Here, the sealing portion 7 and the ejection portion 5 are airtightly fixed to the placement portion 2, so that the ejection portion 5 and the inlet 15B are sealed to communicate with each other in cooperation with the sealing portion 7 and the placement portion 2. At this time, the ejection portion 5 is arranged separately inside of the inlet 15B, and does not come in contact with the inlet 15B. In this state, the ejection portion 5 ejects the purge gas at a predetermined pressure, so that the purge gas is injected into the FOUP 10B.

With the purge gas being injected, the pressure within a space S defined by the ejection portion 5, the placement portion 2, the sealing portion 7 and the inlet 15B is high. Accordingly, when the sealing portion 7 expands, the outer peripheral surface of the sealing portion 7 is pressed towards the inlet 15B, so that the sealing portion 7 is brought into closer contact with the inlet 15B, thus significantly reduced or preventing the leakage of the purge gas.

As explained above, the gas injection device 1 according to the present preferred embodiment includes: the ejection portion 5 that ejects the purge gas; and the sealing portion 7 protruding from the placement portion 2 so as to surround the periphery of the ejection portion 5 when the purge gas is injected into the FOUP 10B. The ejection portion 5, with the purge gas being injected into the inlet 15A, comes in contact with the inlet 15A and then seals the inlet 15A, so that the gas injection device 1 allows the purge gas to be injected through the inlet 15A into the FOUP 10A.

Moreover, the ejection portion 5, with the purge gas being injected into the inlet 15B, does not come in contact with the inlet 15B. At this time, the sealing portion 7 protruding from the placement portion 2 so as to surround the periphery of the ejection portion 5 comes in contact with the inlet 15B and then seals the inlet 15B in cooperation with the placement portion 2. Thus, in the gas injection device 1, the space S defined by the ejection portion 5, the placement portion 2, the sealing portion 7 and the inlet 15B is kept airtight, so that the purge gas ejected from the ejection portion 5 is able to be injected into the inlet 15B.

Subsequently, the sealing portion 7, with the purge gas being injected into the inlet 15A, is structured and arranged not to impede the contact between the ejection portion 5 and the inlet 15A, so that the purge gas is able to be injected through the ejection portion 5 into the inlet 15A without hindrance. With such a configuration, even when each container has different inlet diameters, the gas injection device 1 allows the purge gas to be injected into the various containers.

In addition, the sealing portion 7 includes an elastic body, thus enabling the sealing portion to easily deform. Accordingly, when the purge gas is injected into the inlet 15A, the sealing portion 7 becomes deformed, such that the contact between the ejection portion 5 and the inlet 15A is not impeded.

Moreover, the sealing portion 7 includes a film-shaped elastic body, is tilted towards the inside with the purge gas being injected into the inlet 15B, includes a leading end portion 7c positioned into the inlet 15B and coming in contact with the inlet 15B. Accordingly, with the purge gas being injected into the inlet 15B, by the pressure of gas in the space S defined by the ejection portion 5, the placement portion 2, the sealing portion 7 and the inlet 15B, the sealing portion 7 is pushed towards the inlet 15B and the sealing portion 7 is easily brought into close contact with the inlet 15B, thus being able to significantly reduce or prevent gas leakage.

Furthermore, in the sealing portion (assisting member) 7, the side wall portion 7b is extended from the base portion 7a which surrounds the periphery of the ejection portion 5, so that the sealing portion 7 protrudes from the placement portion 2 so as to surround the periphery of the ejection portion 5. Accordingly, when the purge gas is injected into the inlet 15B which has a diameter larger than the ejection portion 5, the sealing portion 7 is capable of sealing the inlet 15B. Additionally, since the side wall portion 7b of the sealing portion 7 preferably has a tapered shape, the pressure of gas flowing inside of the sealing portion 7 allows the sealing portion 7 to be easily brought into close contact with the inlet 15B, thus being able to significantly reduce or prevent gas leakage.

Figure 6A:
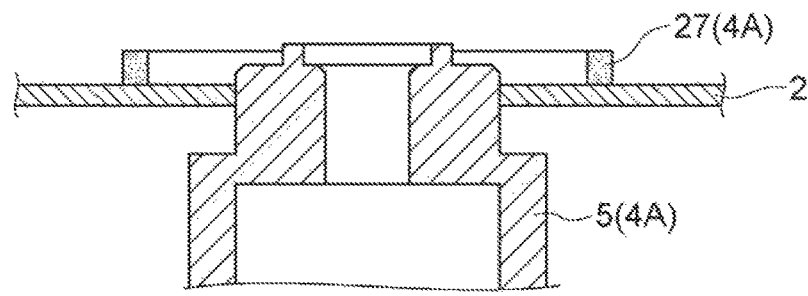
FIGS. 6A-6C are partially enlarged sectional views each showing the relationship between the gas injection device and the FOUP according to alternative preferred embodiments of the present invention.
Figure 6B:
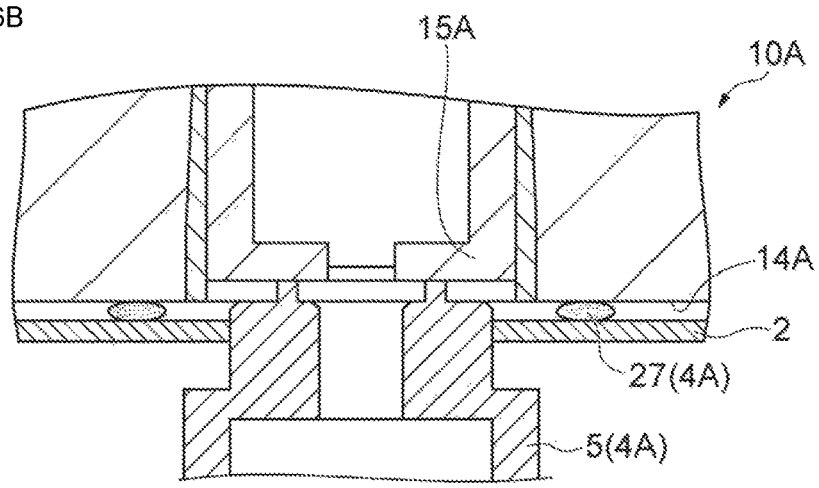
Figure 6C:
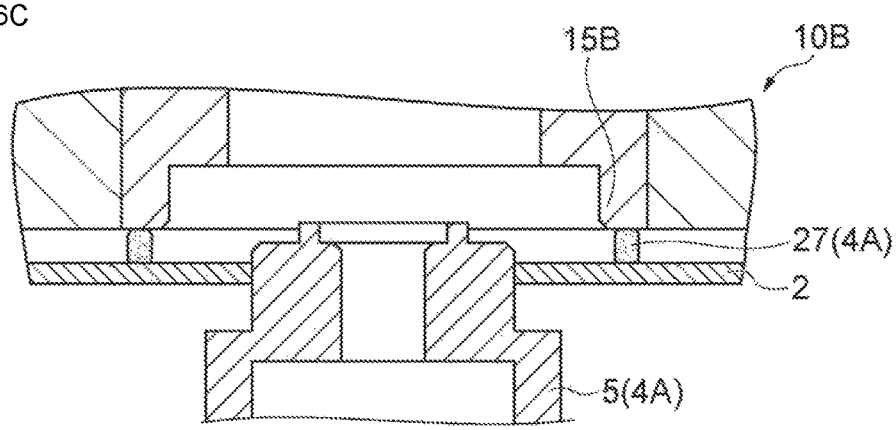

The present invention is not limited to the above-described preferred embodiments. For example, the above preferred embodiments has the sealing portion 7 preferably with a tapered shape so as to tilt towards the inside; however the present invention is not limited to this. As shown in FIG. 6A, a sealing portion 27 of a gas injection portion 4A is an annular member that includes an elastic body, and its cross-sectional shape, for example, may be rectangular or substantially rectangular. In this case, when the purge gas is injected into the FOUP 10A, the sealing portion 27 is pressed by the base portion 14A of the FOUP 10A, so that the sealing portion 27 is elastically deformed, thus not impeding the contact between the ejection portion 5 and the inlet 15A (refer to FIG. 6B). Additionally, when the purge gas is injected into the FOUP 10B, the sealing portion 27 is pressed by the FOUP 10B, so that the sealing portion 27 and the inlet 15B are brought into close contact, such that the ejection portion 5 and the inlet 15B are sealed to communicate with each other (refer to FIG. 6C). In this manner, the shape of the sealing portion is not particularly limited, other than the above-described preferred embodiments, for example, the cross-sectional shape may be trapezoidal, semicircular, inverted U-shaped, or the like.

Additionally, the above preferred embodiments exemplify that the sealing portion 7 preferably is engaged with the annular groove portion 2b provided on the placement portion 2, but the present invention is not limited to this. For example, the sealing portion may be structured and arranged to be fixed to a flat placement portion by an adhesive or the like. In this case, by separately attaching the assisting member to the gas injection device not provided with the sealing portion, the assisting member may function as a sealing portion. The sealing portion may also be configured to be capable of being housed within the placement portion by moving up and down using an actuator, or the like. In this case, only when the purge gas is injected into the FOUP 10B, the sealing portion is able to protrude.

Moreover, the above preferred embodiments describe the FOUPs 10A, 10B, where only the inlets 15A, 15B and the outlet 16A, 16B are different, as a container into which the gas is injected; however other parts may be different without being limited by this. Other than a FOUP, various items such as a SMIF pod can be also used as a container.

Furthermore, the above preferred embodiments show the configuration where the sealing portion 7 comes in contact with the inlet 15B of the FOUP 10B, when the FOUP 10B is placed on the placement portion 2; however the present invention is not limited to this. The sealing portion 7, with the purge gas being injected into the inlet 15B of the FOUP 10B, is preferably structured and arranged to be capable of sealing the ejection portion 5 and the inlet 15B to communicate with each other in cooperation with the placement portion 2, therefore it may come in contact with a peripheral edge of the inlet 15B, and for example, may come in contact with the base portion 14B.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A gas injection device configured to inject a purge gas into a first inlet provided on a first container, and configured to inject the purge gas into a second inlet provided on a second container, the second inlet on the second container having a diameter larger than that of the first inlet on the first container, the gas injection device comprising:
   a placement portion on which one of the first container and the second container is selectively placed;
   an ejection portion which is placed on the placement portion and ejects the purge gas; and
   a sealing portion protruding from the placement portion and surrounding a periphery of the ejection portion; wherein
   the ejection portion is configured to come in contact with the first inlet and seals the first inlet with the purge gas being injected into the first inlet;
   the ejection portion is configured to not come in contact with the second inlet with the purge gas being injected into the second inlet;
   the sealing portion, with the purge gas being injected into the second inlet, is configured to come in contact with the second inlet or a peripheral edge of the second inlet and seals the second inlet in cooperation with the placement portion; and
the sealing portion is configured to not impede the contact between the ejection portion and the first inlet with the purge gas being injected into the first inlet.

2. The gas injection device according to claim 1, wherein the sealing portion includes an elastic body.

3. The gas injection device according to claim 2, wherein the sealing portion includes a plate-shaped elastic body, the sealing portion is configured to be tilted towards the ejection portion with the purge gas being injected into the second inlet, and includes a leading end portion configured to be positioned into the second inlet and to come in contact with the second inlet.

4. The gas injection device according to claim 1, wherein the sealing portion is spaced away from the periphery of the ejection portion.

* * * * *